United States Patent
Endo et al.

(10) Patent No.: US 7,338,743 B2
(45) Date of Patent: Mar. 4, 2008

(54) RESIST MATERIAL AND PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 127 days.

(21) Appl. No.: 11/197,296

(22) Filed: Aug. 5, 2005

(65) Prior Publication Data

US 2006/0051702 A1    Mar. 9, 2006

(30) Foreign Application Priority Data

Sep. 1, 2004    (JP)   ............................ 2004-254170

(51) Int. Cl.
*G03C 1/76* (2006.01)
*G03C 1/492* (2006.01)
*G03C 1/494* (2006.01)
*G03C 5/00* (2006.01)

(52) U.S. Cl. .................... 430/270.1; 430/311; 430/325

(58) Field of Classification Search ............. 430/270.1, 430/311, 325
See application file for complete search history.

(56) References Cited

U.S. PATENT DOCUMENTS 6,506,534 B1 *   1/2003   Nozaki et al. ............ 430/270.1
2001/0016298 A1 *   8/2001   Nakanishi et al. ........ 430/270.1

OTHER PUBLICATIONS

Switkes, M. et al., "Immersion lithography at 157 nm" J. Vac. Sci. Technol., vol. B19(6), Nov./Dec. 2001, pp. 2353-2356.

* cited by examiner

*Primary Examiner*—Geraldina Visconti
(74) *Attorney, Agent, or Firm*—McDermott Will & Emery LLP

(57) ABSTRACT

A resist material includes a first polymer in which part of alkali-soluble groups are protected by an acid labile group labilized by an acid; a second polymer in which substantially all alkali-soluble groups are protected by an acid labile group labilized by an acid; and an acid generator.

11 Claims, 9 Drawing Sheets

RESIST MATERIAL AND PATTERN FORMATION METHOD

CROSS-REFERENCE TO RELATED APLICATIONS

This application claims priority under 35 U.S.C. §119 on Patent Application No. 2004-254170 filed in Japan on Sep. 1, 2004, the entire contents of which are hereby incorporated by reference.

BACKGROUND OF THE INVENTION

The present invention relates to a resist material used for forming a resist film in fabrication process or the like for semiconductor devices and a pattern formation method using the same.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B 19, p. 2353 (2001)).

In the immersion lithography, a region in an exposure system sandwiched between a projection lens and a resist film formed on a wafer is filled with a liquid having a refractive index n and therefore, the NA (numerical aperture) of the exposure system has a value n·NA. As a result, the resolution of the resist film can be improved.

Now, a conventional pattern formation method employing the immersion lithography will be described with reference to FIGS. 1A through 1D.

First, a positive chemically amplified resist material having the following composition is prepared:

| | |
|---|---|
| Base polymer: poly((norbornene-5-methylenehexafluoroisopropyl alcohol ethoxymethyl ether) (40 mol %) – (norbornene-5-methylenehexafluoroisopropyl alcohol) (60 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Next, as shown in FIG. 1A, the aforementioned chemically amplified resist material is applied on a substrate 1 so as to form a resist film 2 with a thickness of 0.35 µm.

Then, as shown in FIG. 1B, with water 3 for immersion lithography provided on the resist film 2, pattern exposure is carried out by irradiating the resist film 2 with exposing light 4 of ArF excimer laser with NA of 0.68 through a mask 5.

After the pattern exposure, as shown in FIG. 1C, the resist film 2 is baked with a hot plate at a temperature of 105° C. for 60 seconds, and the resultant resist film is developed with a 0.26 N tetramethylammonium hydroxide developer. In this manner, a resist pattern 2a made of an unexposed portion of the resist film 2 is formed as shown in FIG. 1D.

As shown in FIG. 1D, however, the resist pattern 2a formed by the conventional pattern formation method is in a defective shape.

SUMMARY OF THE INVENTION

The present inventors have variously examined the reason why the resist pattern 2a formed by the conventional immersion lithography is in a defective shape, resulting in finding the following:

Since the resist film 2 is in contact with the water 3 used for immersion lithography, the water 3 permeates into the resist film 2 and hence the resist film 2 is softened. As a result, the resist film 2 is easily dissolved in the developer.

Specifically, the conventional resist material generally includes, in its skeleton, a polymer of a base polymer 10 as shown in FIG. 2A, wherein a reference numeral 10a denotes a straight chain corresponding to the skeleton, a reference numeral 10b denotes a side chain and a reference numeral 10c denotes a terminal group. In the terminal group 10c, "R" of "OR" indicates an alkyl group. An interaction 12 of a hydrogen bond as shown in FIG. 1B is caused between a hydroxyl group (OH group) corresponding to another terminal group 10c of the side chain 10b and an OH group included in the water ($H_2O$) used as the immersion liquid or an immersion liquid other than water. Through this interaction 12, a component of the resist film 2 elutes into the liquid or a part of the liquid permeates into the resist film 2, so as to soften the resist film 2. When the resist film 2 is softened, the base polymer easily attains ionicity through the interaction between the base polymer and an OH group of the liquid, and therefore, the base polymer easily interacts with an alkaline group included in the developer, so as to easily dissolve in the developer. Properly, since a particularly large number of OH groups are present in the exposed portion of the resist film 2 owing to an acid generated through the irradiation with the exposing light, the resist film 2 is easily dissolved in the developer in the exposed portion, and hence, the contrast against the unexposed portion is increased. However, since the resist film 2 is already softened through the contact with the immersion liquid in the aforementioned manner, the unexposed portion of the resist film 2 is easily dissolved in the developer.

Since the unexposed portion of the resist film 2 is easily dissolved in the developer in this manner, a ratio between the solubility of the exposed portion in the developer and the solubility of the unexposed portion in the developer (namely, the contrast) is lowered, resulting in degrading the shape of the resist pattern 2a. Accordingly, when the resist pattern 2a in a defective shape is used for etching a target film, a pattern of the target film is also in a defective shape. As a result, the productivity and the yield in the fabrication process for semiconductor devices are disadvantageously lowered.

In consideration of this conventional problem, an object of the invention is forming a fine pattern in a good shape by preventing a resist film from being softened by an immersion liquid.

In order to achieve the object, according to the invention, for improving a contrast of a resist film used in the immersion lithography, a base polymer includes a plurality of base polymers respectively different in the ratio of terminal groups of alkali-soluble groups of the base polymer protected by an acid labile group labilized through contact with an acid. Furthermore, the base polymer includes a compound in which an alkali-soluble group is protected by an acid labile group, or a compound or a polymer in which an alkali-soluble group is protected by an acid stable group.

Thus, an unexposed portion of a resist film is minimally dissolved in an immersion liquid, and hence, the ratio in the dissolution rate in a developer between an exposed portion and an unexposed portion (i.e., the contrast) can be improved.

This improvement of the contrast will be specifically described with reference to FIGS. 3A and 3B. According to the present invention, a base polymer used for forming a resist film includes at least two kinds of different polymers as described above. Specifically, as shown in FIG. 3A, a resist film 20 of this invention is constructed from a mixture of a first base polymer 20A having an OH group, an alkyl group, a group decomposed by an acid or the like on a side chain and a second base polymer 20B in which almost all the terminal groups of side chains are groups decomposed by an acid to be alkali-soluble (i.e., OR groups). Owing to this structure, the proportion of groups that are changed to be alkali-soluble by an acid is much larger than in a conventional resist material, resulting in attaining a high contrast.

A conventional base polymer 10 includes, as shown in FIG. 3B, a group having an OH group or a group changed to be alkali-soluble through a reaction with an acid, such as an alkyl group, on a side chain. Specifically, in the conventional base polymer 10, the proportion of substituent groups represented by a chemical formula of OR, which is changed to be alkali-soluble through a reaction with an acid, is not very large. Therefore, when the interaction between an immersion liquid and a resist film is caused, there is not a large difference between the proportion of alkali-soluble groups present in the unexposed portion $2a$ and that present in the exposed portion $2b$, and hence, the contrast is lowered.

On the contrary, according to this invention, the second base polymer 20B in which almost all the terminal groups of the side chains are replaced with (protected by) the groups decomposed by an acid to be alkali-soluble (namely, OR groups) as shown in FIG. 3A. Therefore, an unexposed portion $20a$ minimally interacts with an immersion liquid but the solubility of an exposed portion $20b$ in a developer is remarkably improved because it includes a large number of terminal OH groups.

The present invention was devised on the basis of the aforementioned finding, and a resist material of the invention has a structure including a polymer or a compound in which substantially all alkali-soluble groups are protected by an acid labile group, a structure including a polymer or a compound in which an alkali-soluble group is protected by an acid stable group or a structure obtained by combining these structures. Specifically, the present invention is practiced as follows:

The first resist material of this invention includes a first polymer in which part of alkali-soluble groups are protected by an acid labile group labilized by an acid; a second polymer in which substantially all alkali-soluble groups are protected by an acid labile group labilized by an acid; and an acid generator.

In the first resist material, an immersion liquid minimally permeates into an unexposed portion of a resist film owing to the second polymer in which substantially all alkali-soluble groups are protected by an acid labile group, and therefore, the resist film is prevented from being softened and its dissolution rate in a developer is lowered. On the other hand, in an exposed portion, the acid labile group is inactivated (protecting-deblocked) by an acid generated from the acid generator, and hence the exposed portion is easily dissolved in the developer. Accordingly, a ratio between the solubility of the exposed portion in the developer and the solubility of the unexposed portion in the developer (i.e., the contrast) is improved, so that a resist pattern can be formed in a good shape.

The second resist material of this invention includes a polymer in which part of alkali-soluble groups are protected by an acid labile group labilized by an acid; a compound in which substantially all alkali-soluble groups are protected by an acid labile group labilized by an acid; and an acid generator.

In the second resist material, an immersion liquid minimally permeates into an unexposed portion of a resist film owing to the compound in which substantially all alkali-soluble groups are protected by an acid labile group, and therefore, the resist film is prevented from being softened and its dissolution rate in a developer is lowered. On the other hand, in an exposed portion, the acid labile group is inactivated (protecting-deblocked) by an acid generated from the acid generator, and hence the exposed portion is easily dissolved in the developer. Accordingly, a ratio between the solubility of the exposed portion in the developer and the solubility of the unexposed portion in the developer (i.e., the contrast) is improved, so that a resist pattern can be formed in a good shape.

The third resist material of this invention includes a first polymer; a first compound in which an alkali-soluble group is protected by an acid labile group labilized by an acid; a second polymer in which substantially all alkali-soluble groups are protected by an acid labile group labilized by an acid; and an acid generator.

In the third resist material, an immersion liquid minimally permeates into an unexposed portion of a resist film owing to the second polymer and the compound in which substantially all alkali-soluble groups are protected by an acid labile group, and therefore, the resist film is prevented from being softened and its dissolution rate in a developer is lowered. On the other hand, in an exposed portion, the acid labile group is inactivated (protecting-deblocked) by an acid generated from the acid generator, and hence the exposed portion is easily dissolved in the developer. Accordingly, a ratio between the solubility of the exposed portion in the developer and the solubility of the unexposed portion in the developer (i.e., the contrast) is improved, so that a resist pattern can be formed in a good shape.

The fourth resist material of this invention includes a first polymer in which part of alkali-soluble groups are protected by an acid labile group labilized by an acid; a second polymer in which an alkali-soluble group is protected by an acid stable group; and an acid generator.

In the fourth resist material, an immersion liquid minimally permeates into an unexposed portion of a resist film and the acid stable group is not inactivated owing to the second polymer in which an alkali-soluble group is protected by an acid stable group, and therefore, the dissolution rate in a developer of the resist material is further lowered. On the other hand, in an exposed portion, the acid labile group of the first polymer is inactivated (protecting-deblocked) by an acid generated from the acid generator, and hence the exposed portion is dissolved in the developer. Accordingly, a ratio between the solubility of the exposed portion in the developer and the solubility of the unexposed portion in the developer (i.e., the contrast) is improved, so that a resist pattern can be formed in a good shape.

The first or fourth resist material may include a compound in which an alkali-soluble group is protected by an acid labile group labilized by an acid.

The first or fourth resist material may include a compound in which an alkali-soluble group is protected by an acid stable group.

The fifth resist material of this invention includes a polymer in which part of alkali-soluble groups are protected by an acid labile group labilized by an acid; a compound in which an alkali-soluble group is protected by an acid stable group; and an acid generator.

In the fifth resist material, an immersion liquid minimally permeates into an unexposed portion of a resist film and the acid stable group is not inactivated owing to the compound in which an alkali-soluble group is protected by an acid stable group, and therefore, the dissolution rate in a developer of the resist film is further lowered. On the other hand, in an exposed portion, the acid labile group of the polymer is inactivated (protecting-deblocked) by an acid generated from the acid generator, and hence the exposed portion is dissolved in the developer. Accordingly, a ratio between the solubility of the exposed portion in the developer and the solubility of the unexposed portion in the developer (i.e., the contrast) is improved, so that a resist pattern can be formed in a good shape.

The sixth resist material of this invention includes a first polymer; a first compound in which an alkali-soluble group is protected by an acid labile group labilized by an acid; a second polymer in which an alkali-soluble group is protected by an acid stable group; and an acid generator.

In the sixth resist material, an immersion liquid minimally permeates into an unexposed portion of a resist film owing to the first compound in which an alkali-soluble group is protected by an acid labile group and the second polymer in which an alkali-soluble group is protected by an acid stable group, and therefore, the resist film is prevented from being softened and its dissolution rate in a developer is lowered. On the other hand, in an exposed portion, the acid labile group is inactivated (protecting-deblocked) by an acid generated from the acid generator, and hence the exposed portion is easily dissolved in the developer. Accordingly, a ratio between the solubility of the exposed portion in the developer and the solubility of the unexposed portion in the developer (i.e., the contrast) is improved, so that a resist pattern can be formed in a good shape.

The third or sixth resist material may include a second compound in which an alkali-soluble group is protected by an acid stable group.

In each of the first through third resist materials, in the second polymer or the compound in which substantially all alkali-soluble groups are protected by an acid labile group labilized by an acid, there is no need to protect all the alkali-soluble groups by the acid labile group. When 70% or more and less than 100% of the alkali-soluble groups are protected, the dissolution rate of the unexposed portion of the resist film can be lowered to improve the contrast in the dissolution rate.

Also, in each of the first, second, fourth and fifth resist materials, in the polymer in which part of alkali-soluble groups are protected by an acid labile group, the proportion of the acid labile group is not particularly specified but may be, for example, not less than 30% and not more than 60%, which does not limit the invention.

Furthermore, in the resist material of this invention, the first polymer and the second polymer may have the same composition. Also, the content of the second polymer in the first polymer is preferably approximately not less than 5 wt % and not more than 50 wt %, which does not limit the invention.

Moreover, in the resist material of this invention, the content of the compound (first compound) in the polymer (first polymer) is preferably approximately not less than 5 wt % and not more than 50 wt %, which does not limit the invention.

In the resist material of this invention, the polymer can be polyhydroxystyrene, polymethacrylic acid, polyacrylic acid, polynorbornene carboxylic acid, polynorbornene methylenehexafluoroisopropyl alcohol, polynorbornene hexafluoroisopropyl alcohol, a norbornene hexafluoroisopropyl alcohol/maleic anhydride copolymer, a norbornene carboxylic acid/maleic anhydride copolymer or a norbornene methylenehexafluoroisopropyl alcohol/maleic anhydride copolymer.

In the resist material of this invention, the compound to be included can be hydroxystyrene, bisphenol A, pyrogallol, methacrylic acid, acrylic acid, norbornene carboxylic acid, norbornene methylenehexafluoroisopropyl alcohol, norbornene hexafluoroisopropyl alcohol, norbornene hexafluoroisopropyl alcohol/maleic anhydride, norbornene carboxylic acid/maleic anhydride or norbornene methylenehexafluoroisopropyl alcohol/maleic anhydride.

In the resist material of this invention, the alkali-soluble groups can be hydroxy groups or carboxylic groups.

In the resist material of this invention, the acid labile group can be a t-butyl group, a t-butyloxycarbonyl group, a methoxymethyl group or a 2-methyl-2-adamantyl group.

In the resist material of this invention, the acid stable group can be a methyl group, an ethyl group, an isopropyl group, an adamantyl group or an isobornyl group.

In the resist material of this invention, the acid generator can be at least one of triphenylsulfonium trifluoromethane sulfonate (triphenylsulfonium triflate), triphenylsulfonium nonafluorobutane sulfonate, triphenylsulfonium perfluorooctane sulfonate, diphenyliodonium trifluoromethane sulfonate, diphenyliodonium nonafluorobutane sulfonate, diphenyliodonium perfluorooctane sulfonate, di(p-t-butylphenyl)iodonium trifluoromethane sulfonate, di(p-t-butylphenyl) nonafluorobutane sulfonate and di(p-t-butylphenyl) perfluorooctane sulfonate.

The first pattern formation method of this invention uses the first resist material of the invention for forming a resist film, and includes the steps of forming a resist film on a substrate; performing pattern exposure by selectively irradiating the resist film with exposing light with a liquid provided on the resist film; and forming a resist pattern by developing the resist film after the pattern exposure, and the resist film is made of a resist material including a first polymer in which part of alkali-soluble groups are protected by an acid labile group labilized by an acid; a second polymer in which substantially all alkali-soluble groups are protected by an acid labile group labilized by an acid; and an acid generator.

The second pattern formation method of this invention uses the second resist material of the invention for forming a resist film, and includes the steps of forming a resist film on a substrate; performing pattern exposure by selectively irradiating the resist film with exposing light with a liquid provided on the resist film; and forming a resist pattern by developing the resist film after the pattern exposure, and the resist film is made of a resist material including a polymer in which part of alkali-soluble groups are protected by an acid labile group labilized by an acid; a compound in which substantially all alkali-soluble groups are protected by an acid labile group labilized by an acid; and an acid generator.

The third pattern formation method of this invention uses the third resist material of the invention for forming a resist film, and includes the steps of forming a resist film on a substrate; performing pattern exposure by selectively irradiating the resist film with exposing light with a liquid provided on the resist film; and forming a resist pattern by developing the resist film after the pattern exposure, and the resist film is made of a resist material including a first polymer; a first compound in which an alkali-soluble group is protected by an acid labile group labilized by an acid; a second polymer in which substantially all alkali-soluble groups are protected by an acid labile group labilized by an acid; and an acid generator.

The fourth pattern formation method of this invention uses the fourth resist material of the invention for forming a resist film, and includes the steps of forming a resist film on a substrate; performing pattern exposure by selectively irradiating the resist film with exposing light with a liquid provided on the resist film; and forming a resist pattern by developing the resist film after the pattern exposure, and the resist film is made of a resist material including a first polymer in which part of alkali-soluble groups are protected by an acid labile group labilized by an acid; a second polymer in which an alkali-soluble group is protected by an acid stable group; and an acid generator.

In the first or fourth pattern formation method, the resist material may include a compound in which an alkali-soluble group is protected by an acid labile group labilized by an acid.

The fifth pattern formation method of this invention uses the fifth resist material of the invention for forming a resist film, and includes the steps of forming a resist film on substrate; performing pattern exposure by selectively irradiating the resist film with exposing light with a liquid provided on the resist film; and forming a resist pattern by developing the resist film after the pattern exposure, and the resist film is made of a resist material including a polymer in which part of alkali-soluble groups are protected by an acid labile group labilized by an acid; a compound in which an alkali-soluble group is protected by an acid stable group; and an acid generator.

The sixth pattern formation method of this invention uses the sixth resist material of the invention for forming a resist film, and includes the steps of forming a resist film on a substrate; performing pattern exposure by selectively irradiating the resist film with exposing light with a liquid provided on the resist film; and forming a resist pattern by developing the resist film after the pattern exposure, and the resist film is made of a resist material including a first polymer; a first compound in which an alkali-soluble group is protected by an acid labile group labilized by an acid; a second polymer in which an alkali-soluble group is protected by an acid stable group; and an acid generator.

In the first or fourth pattern formation method, the resist material may include a compound in which an alkali-soluble group is protected by an acid stable group.

In the third or sixth pattern formation method, the resist material may include a second compound in which an alkali-soluble group is protected by an acid stable group.

In the pattern formation method of this invention, the liquid can be water or perfluoropolyether.

In the pattern formation method of this invention, the exposing light can be KrF excimer laser, $Xe_2$ laser, ArF excimer laser, $F_2$ laser, KrAr laser or $Ar_2$ laser.

BRIEF DESCRIPTION OF THE DRAWINGS

FIG. 3A is a schematic diagram of a resist film of the invention and FIG. 3B is a schematic diagram of a conventional resist film;

DETAILED DESCRIPTION OF THE INVENTION

Embodiment 1

A pattern formation method according to Embodiment 1 of the invention will now be described with reference to FIGS. 4A through 4D.

First, a positive chemically amplified resist material having the following composition is prepared:

| | |
|---|---|
| First base polymer: poly((norbornene-5-methylenehexafluoroisopropyl alcohol ethoxymethyl ether) (40 mol %) – (norbornene-5-methylenehexafluoroisopropyl alcohol) (60 mol %)) | 2 g |
| Second base polymer: poly(2-methyl-2-adamantyl methacrylate) | 0.3 g |
| Acid generator: triphenylsulfonium triflate | 0.06 g |
| Quencher: triethanolamine | 0.002 g |
| Solvent: propylene glycol monomethyl ether acetate | 20 g |

Figure 1A:
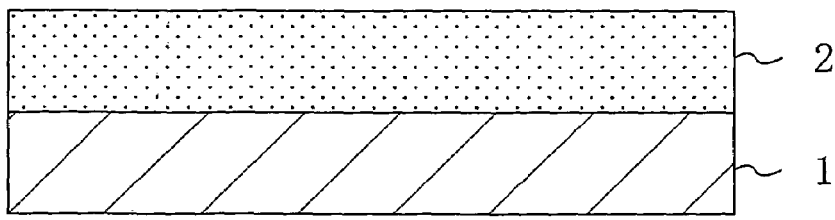
FIGS. 1A, 1B, 1C and 1D are cross-sectional views for showing procedures in a conventional pattern formation method.
Figure 1B:
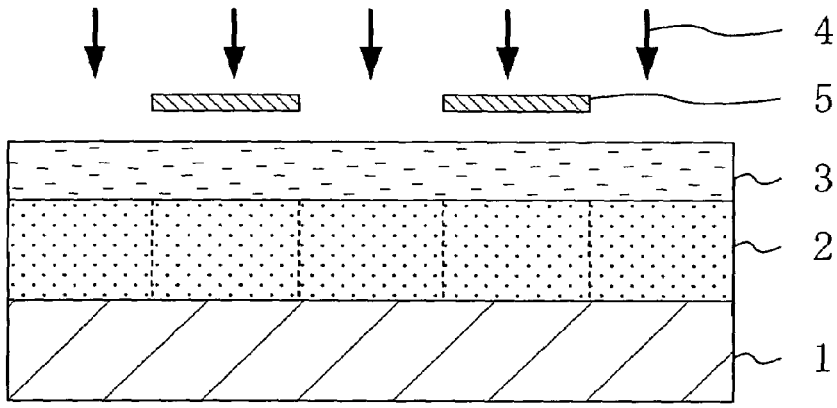
Figure 1C:
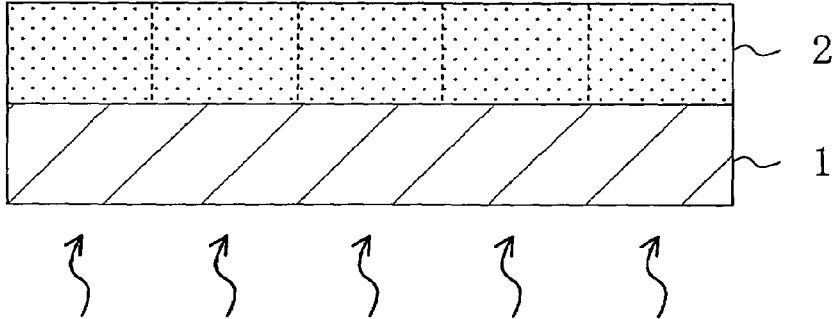
Figure 1D:
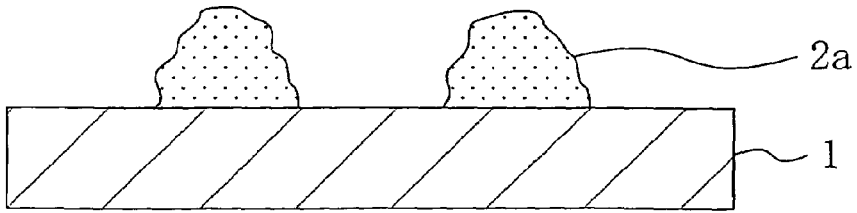
Figure 2A:
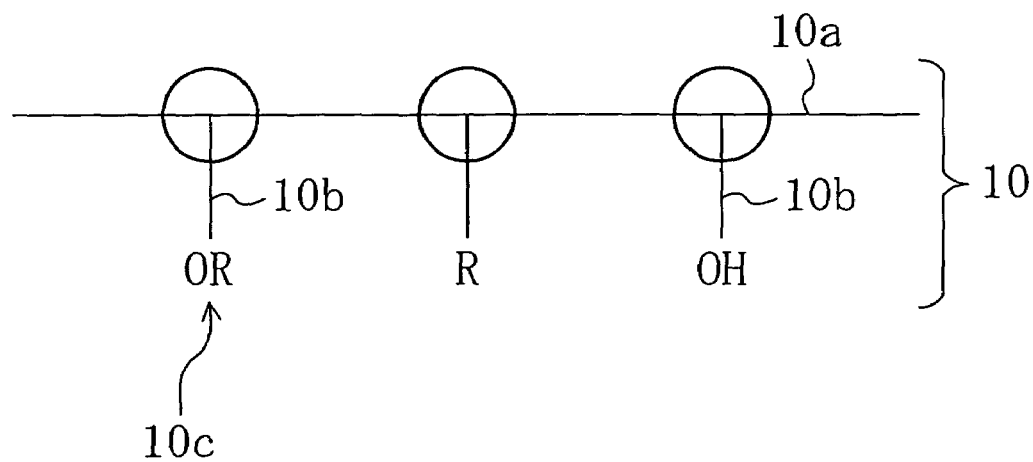
FIGS. 2A and 2B are schematic diagrams of a base polymer included in a conventional resist material shown for explaining a problem to be solved by the invention.
Figure 2B:
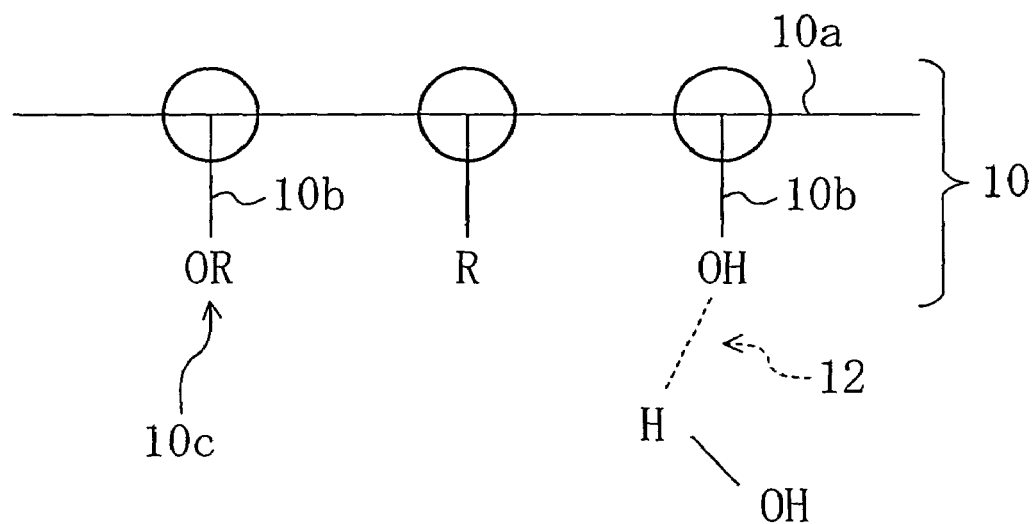
Figure 3A:
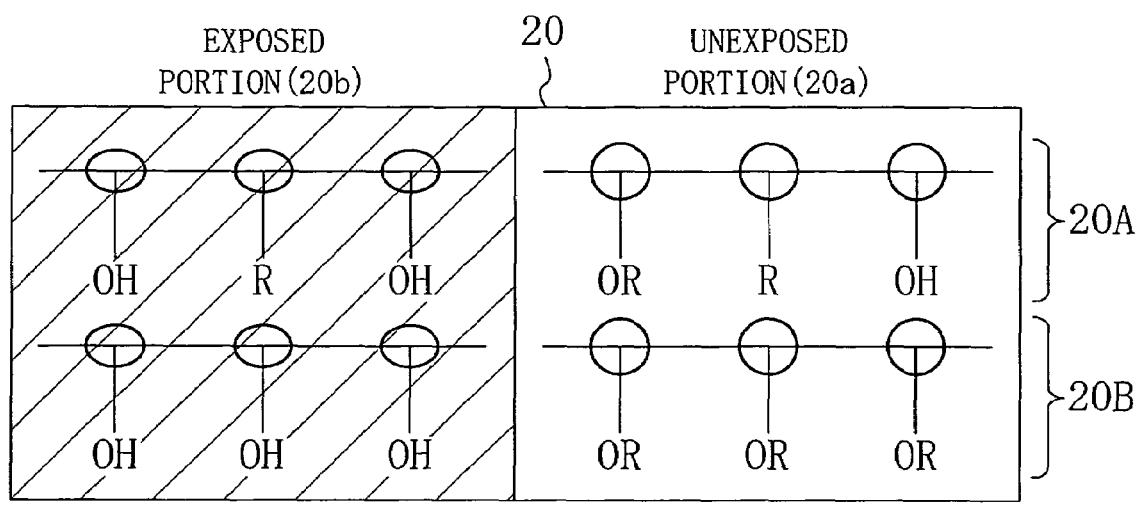
FIGS. 3A and 3B are diagrams of a base polymer included in an exposed portion and an unexposed portion of a resist film, and specifically.
Figure 3B:
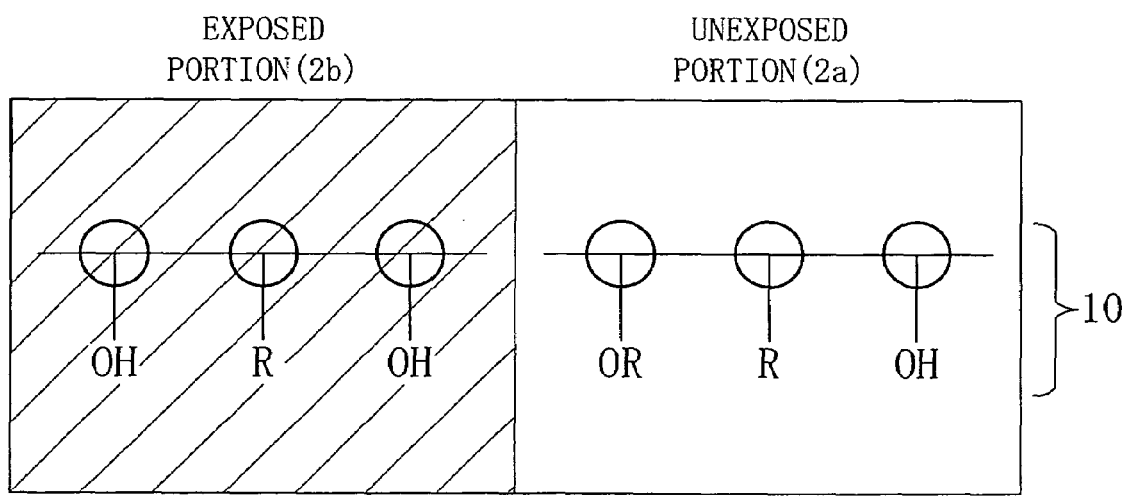
Figure 4A:
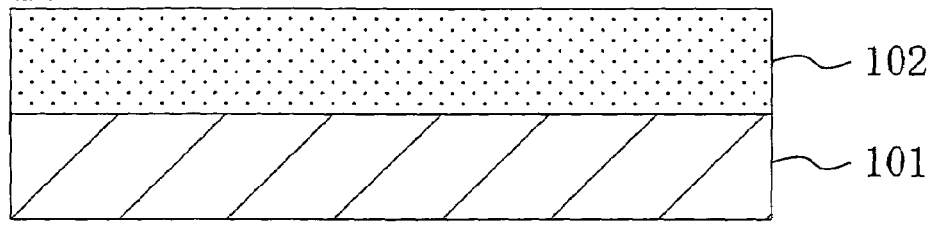
FIGS. 4A, 4B, 4C and 4D are cross-sectional views for showing procedures in a pattern formation method according to Embodiment 1 of the invention.

Next, as shown in FIG. 4A, the aforementioned chemically amplified resist material is applied on a substrate 101 so as to form a resist film 102 with a thickness of 0.35 μm.

Figure 4B:
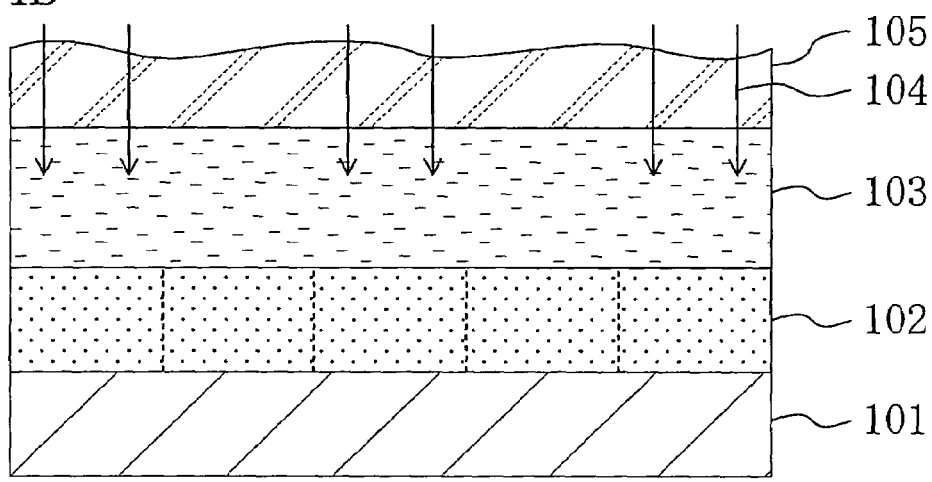

Next, as shown in FIG. 4B, with an immersion liquid 103 of water provided between the resist film 102 and a projection lens 105 by, for example, a puddle method, pattern exposure is carried out by irradiating the resist film 102 through a mask (not shown) with exposing light 104 of ArF excimer laser with NA of 0.68.

Figure 4C:
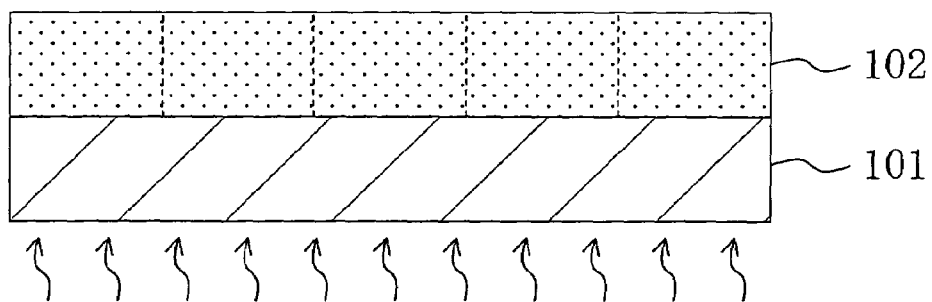

After the pattern exposure, as shown in FIG. 4C, the resist film 102 is baked with a hot plate at a temperature of 105° C. for 60 seconds (post exposure bake).

Figure 4D:
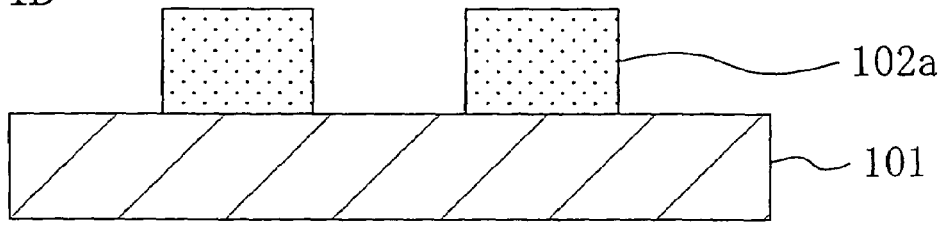

Next, the resultant resist film 102 is developed with a 0.26 N tetramethylammonium hydroxide developer. In this manner, a resist pattern 102a made of an unexposed portion of the resist film 102 and having a line width of 0.09 μm is formed in a good shape as shown in FIG. 4D.

In this manner, according to the pattern formation method of Embodiment 1, in the step of forming the resist film shown in FIG. 4A, the resist material used for forming the resist film 102 includes, in addition to the first base polymer in which part of alkali-soluble groups are protected by an acid labile group labilized by an acid, the polymethacrylic acid corresponding to the second base polymer in which all or, for example, 70% of alkali-soluble groups are protected by an acid labile group labilized by an acid (i.e., a 2-methyl-2-adamantyl group), namely, poly(2-methyl-2-admanatyl methacrylate). Therefore, since an interaction caused between the resist film 102 and the liquid 103 provided on the resist film 102 is reduced, the liquid 103 minimally permeates into the resist film 102, and hence, the resist film 102 is prevented from being softened and its dissolution rate in the developer is lowered. On the contrary, in an exposed portion of the resist film 102, an acid generated from the acid generator through the irradiation with the exposing light 104 inactivates the acid labile groups of the first base polymer and the second base polymer, and hence, the exposed portion is easily dissolved in the developer. As a result, the unexposed portion of the resist film 102 is not affected by the liquid 103, so that the fine resist pattern 102a can be formed in a good shape.

Embodiment 2

A pattern formation method according to Embodiment 2 of the invention will now be described with reference to FIGS. 5A through 5D.

First, a positive chemically amplified resist material having the following composition is prepared:

| | |
|---|---|
| Base polymer: poly((norbornene-5-methylenehexafluoroisopropyl alcohol ethoxymethyl ether) (40 mol %) – (norbornene-5-methylenehexafluoroisopropyl alcohol) (60 mol %)) | 2 g |
| Compound protected by acid labile group: 2-methyl-2-adamantyl methacrylate | 0.3 g |
| Acid generator: triphenylsulfonium triflate | 0.06 g |
| Quencher: triethanolamine | 0.002 g |
| Solvent: propylene glycol monomethyl ether acetate | 20 g |

Figure 5A:
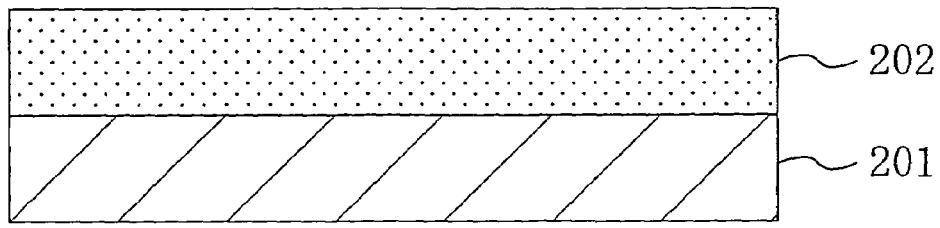
FIGS. 5A, 5B, 5C and 5D are cross-sectional views for showing procedures in a pattern formation method according to Embodiment 2 of the invention.

Next, as shown in FIG. 5A, the aforementioned chemically amplified resist material is applied on a substrate 201 so as to form a resist film 202 with a thickness of 0.35 µm.

Figure 5B:
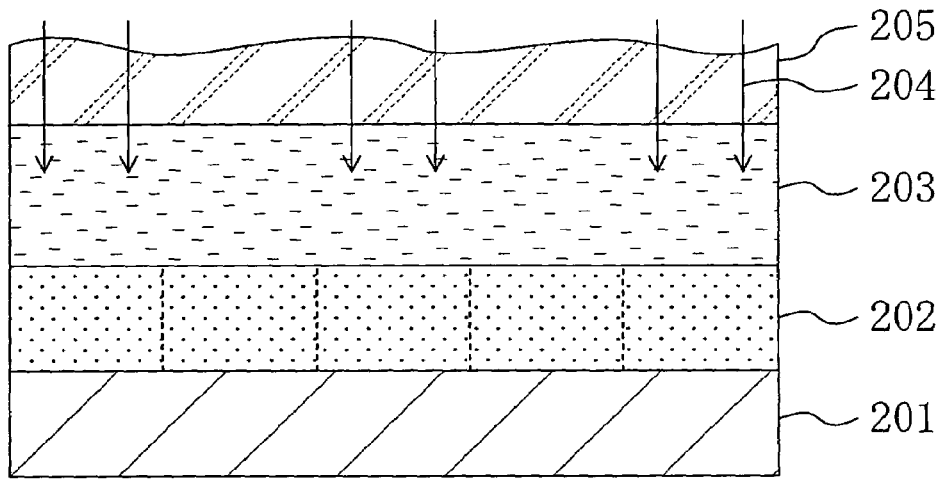

Next, as shown in FIG. 5B, with an immersion liquid 203 of water provided between the resist film 202 and a projection lens 205 by, for example, the puddle method, pattern exposure is carried out by irradiating the resist film 202 through a mask (not shown) with exposing light 204 of ArF excimer laser with NA of 0.68.

Figure 5C:
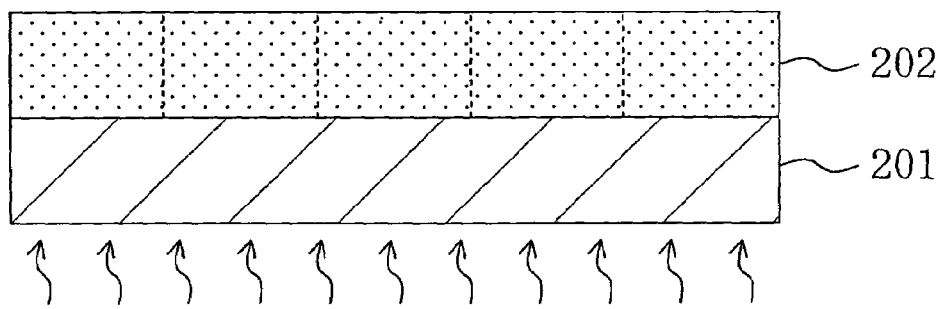

After the pattern exposure, as shown in FIG. 5C, the resist film 202 is baked with a hot plate at a temperature of 105° C. for 60 seconds (post exposure bake).

Figure 5D:
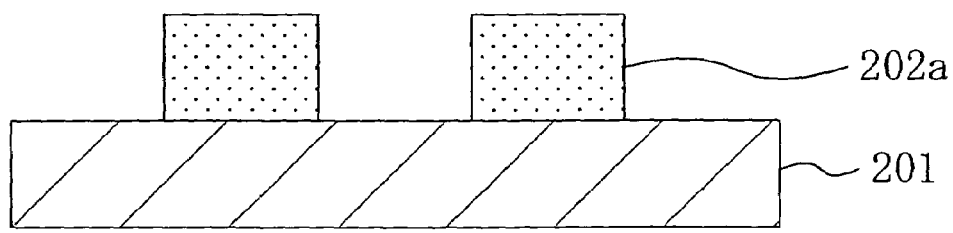

Next, the resultant resist film 202 is developed with a 0.26 N tetramethylammonium hydroxide developer. In this manner, a resist pattern 202a made of an unexposed portion of the resist film 202 and having a line width of 0.09 µm is formed in a good shape as shown in FIG. 5D.

In this manner, according to the pattern formation method of Embodiment 2, in the step of forming the resist film shown in FIG. 5A, the resist material used for forming the resist film 202 includes, in addition to the base polymer in which a part of alkali-soluble groups are protected by an acid labile group labilized by an acid, the methacrylic acid corresponding to the compound in which an alkali-soluble group is protected by an acid labile group labilized by an acid (i.e., a 2-methyl-2-adamantyl group), namely, 2-methyl-2-admanatyl methacrylate. Therefore, since an interaction caused between the resist film 202 and the liquid 203 provided on the resist film 202 is reduced, the liquid 203 minimally permeates into the resist film 202, and hence, the resist film 202 is prevented from being softened and its dissolution rate in the developer is lowered. On the contrary, in an exposed portion of the resist film 202, an acid generated from the acid generator through the irradiation with the exposing light 204 inactivates the acid labile groups of the base polymer and the methacrylic acid, and hence, the exposed portion is easily dissolved in the developer. As a result, the unexposed portion of the resist film 202 is not affected by the liquid 203, so that the fine resist pattern 202a can be formed in a good shape.

Embodiment 3

A pattern formation method according to Embodiment 3 of the invention will now be described with reference to FIGS. 6A through 6D.

First, a positive chemically amplified resist material having the following composition is prepared:

| | |
|---|---|
| First base polymer: poly(norbornene-5-methylenehexafluoroisopropyl alcohol) | 2 g |
| Compound protected by acid labile group: 2-methyl-2-adamantyl methacrylate | 0.3 g |
| Second base polymer: poly(2-methyl-2-adamantyl methacrylate) | 0.2 g |
| Acid generator: triphenylsulfonium triflate | 0.06 g |
| Quencher: triethanolamine | 0.002 g |
| Solvent: propylene glycol monomethyl ether acetate | 20 g |

Figure 6A:
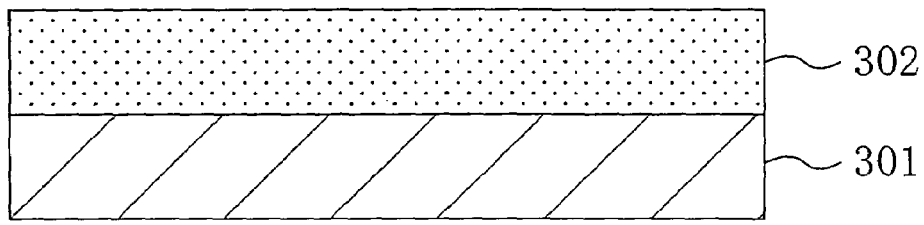
FIGS. 6A, 6B, 6C and 6D are cross-sectional views for showing procedures in a pattern formation method according to Embodiment 3 of the invention.

Next, as shown in FIG. 6A, the aforementioned chemically amplified resist material is applied on a substrate 301 so as to form a resist film 302 with a thickness of 0.35 µm.

Figure 6B:
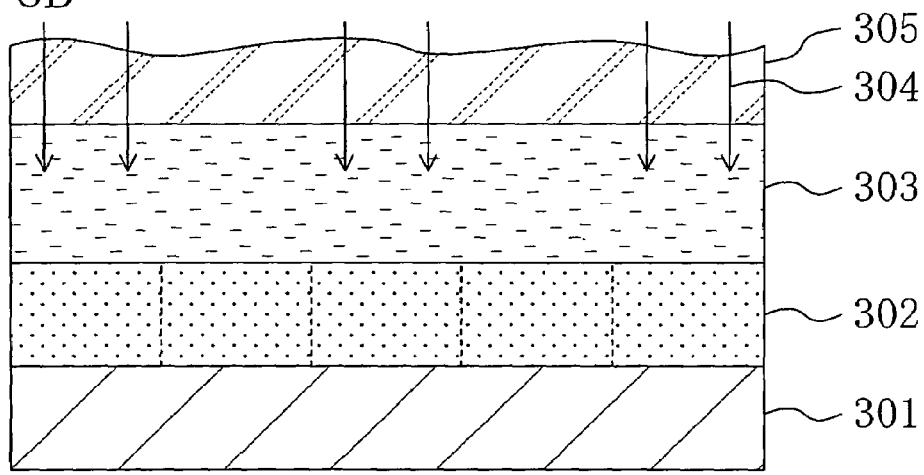

Next, as shown in FIG. 6B, with an immersion liquid 303 of water provided between the resist film 302 and a projection lens 305 by, for example, the puddle method, pattern exposure is carried out by irradiating the resist film 302 through a mask (not shown) with exposing light 304 of ArF excimer laser with NA of 0.68.

Figure 6C:
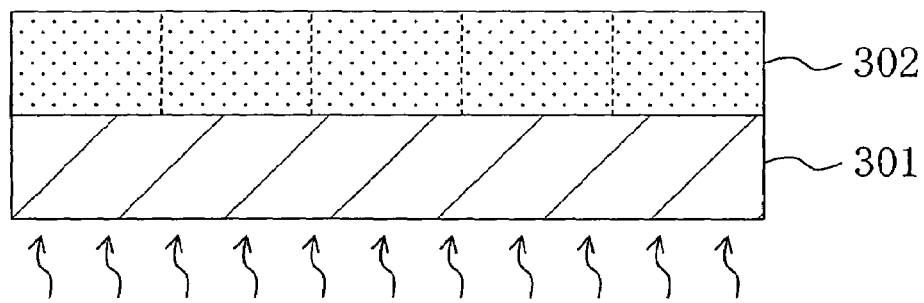

After the pattern exposure, as shown in FIG. 6C, the resist film 302 is baked with a hot plate at a temperature of 105° C. for 60 seconds (post exposure bake).

Figure 6D:
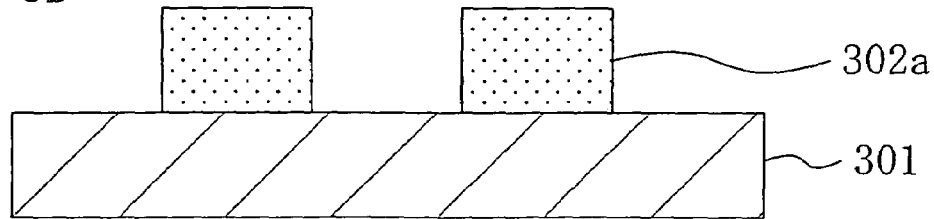

Next, the resultant resist film 302 is developed with a 0.26 N tetramethylammonium hydroxide developer. In this manner, a resist pattern 302a made of an unexposed portion of the resist film 302 and having a line width of 0.09 µm is formed in a good shape as shown in FIG. 6D.

In this manner, according to the pattern formation method of Embodiment 3, in the step of forming the resist film shown in FIG. 6A, the resist material used for forming the resist film 302 includes, in addition to the first base polymer in which part of alkali-soluble groups are protected by an acid labile group labilized by an acid, the acrylic acid corresponding to the compound in which all or, for example, 70% of alkali-soluble groups are protected by an acid labile group labilized by an acid (i.e., a 2-methyl-2-admanatyl group), namely, 2-mehtyl-2-admanatyl acrylate and the polymethacrylic acid corresponding to the second base polymer in which all or, for example, 70% of alkali-soluble groups are protected by an acid labile group labilized by an acid (i.e., a 2-methyl-2-adamantyl group), namely, poly(2- methyl-2-admanatyl methacrylate). Therefore, since an interaction caused between the resist film 302 and the liquid 303 provided on the resist film 302 is reduced, the liquid 303 minimally permeates into the resist film 302, and hence, the resist film 302 is prevented from being softened and its dissolution rate in the developer is lowered. On the contrary, in an exposed portion of the resist film 302, an acid generated from the acid generator through the irradiation with the exposing light 304 inactivates the acid labile groups of the first base polymer, the second base polymer and the methacrylic acid, and hence, the exposed portion is easily dissolved in the developer. As a result, the unexposed portion of the resist film 302 is not affected by the liquid 303, so that the fine resist pattern 302a can be formed in a good shape.

Embodiment 4

A pattern formation method according to Embodiment 4 of the invention will now be described with reference to FIGS. 7A through 7D.

First, a positive chemically amplified resist material having the following composition is prepared:

| | |
|---|---|
| First base polymer: poly((norbornene-5-methylenehexafluoroisopropyl alcohol ethoxymethyl ether) (40 mol %) – (norbornene-5-methylenehexafluoroisopropyl alcohol) (60 mol %)) | 2 g |
| Second base polymer: poly(methyl methacrylate) | 0.3 g |
| Acid generator: triphenylsulfonium triflate | 0.06 g |
| Quencher: triethanolamine | 0.002 g |
| Solvent: propylene glycol monomethyl ether acetate | 20 g |

Figure 7A:
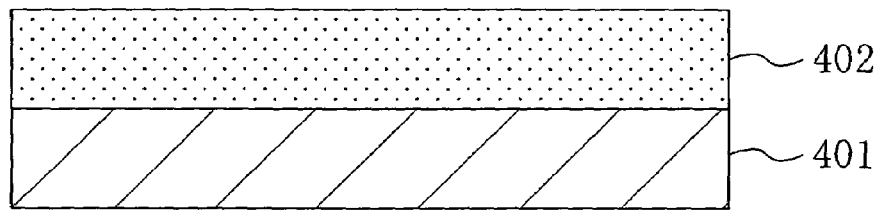
FIGS. 7A, 7B, 7C and 7D are cross-sectional views for showing procedures in a pattern formation method according to Embodiment 4 of the invention.

Next, as shown in FIG. 7A, the aforementioned chemically amplified resist material is applied on a substrate 401 so as to form a resist film 402 with a thickness of 0.35 μm.

Figure 7B:
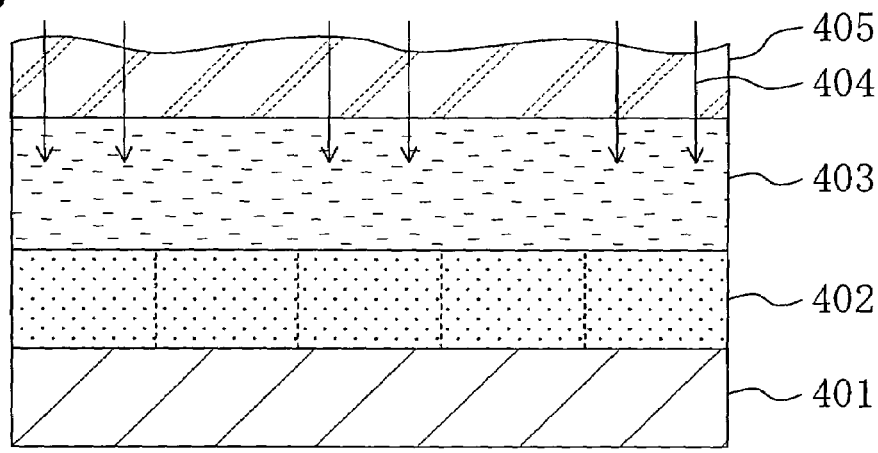

Next, as shown in FIG. 7B, with an immersion liquid 403 of water provided between the resist film 402 and a projection lens 405 by, for example, the puddle method, pattern exposure is carried out by irradiating the resist film 402 through a mask (not shown) with exposing light 404 of ArF excimer laser with NA of 0.68.

Figure 7C:
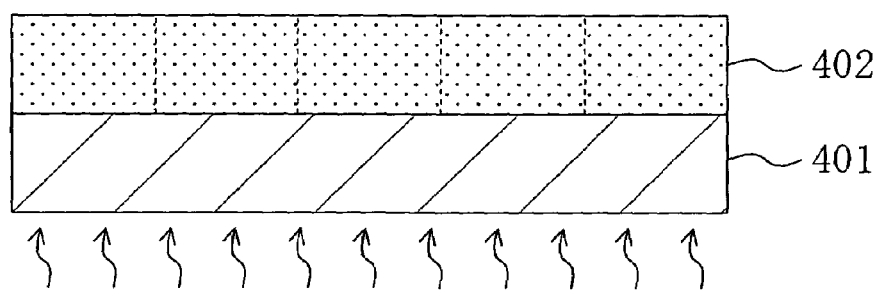

After the pattern exposure, as shown in FIG. 7C, the resist film 402 is baked with a hot plate at a temperature of 105° C. for 60 seconds (post exposure bake).

Figure 7D:
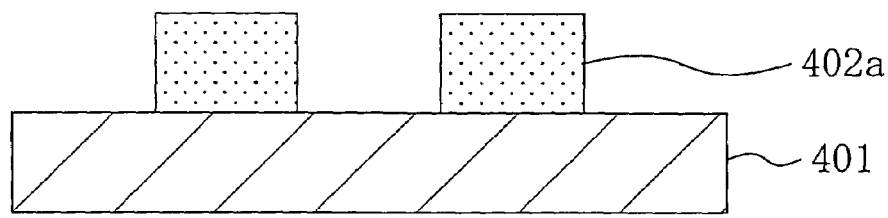

Next, the resultant resist film 402 is developed with a 0.26 N tetramethylammonium hydroxide developer. In this manner, a resist pattern 402a made of an unexposed portion of the resist film 402 and having a line width of 0.09 μm is formed in a good shape as shown in FIG. 7D.

In this manner, according to the pattern formation method of Embodiment 4, in the step of forming the resist film shown in FIG. 7A, the resist material used for forming the resist film 402 includes, in addition to the first base polymer in which part of alkali-soluble groups are protected by an acid labile group labilized by an acid, the polymethacrylic acid corresponding to the second base polymer in which an alkali-soluble group is protected by an acid stable group (i.e., a methyl group), namely, poly(methyl methacrylate). Therefore, since an interaction caused between the resist film 402 and the liquid 403 provided on the resist film 402 is reduced, the liquid 403 minimally permeates into the resist film 402, and hence, the resist film 402 is prevented from being softened and its dissolution rate in the developer is lowered. On the contrary, in an exposed portion of the resist film 402, an acid generated from the acid generator through the irradiation with the exposing light 404 inactivates the acid labile group of the first base polymer, and hence, the exposed portion is easily dissolved in the developer. In addition, since the alkali-soluble group is protected by the acid stable group in the second base polymer, the alkali-soluble group of the second base polymer is not inactivated by the acid generated from the acid generator even in the vicinity of a boundary between the exposed portion and the unexposed portion. Since the alkali-soluble group is thus protected, the unexposed portion is insoluble in the alkaline developer. As a result, the contrast between the exposed portion and the unexposed portion is improved and the unexposed portion of the resist film 402 is not affected by the liquid 403, so that the fine resist pattern 402a can be formed in a good shape.

Embodiment 5

A pattern formation method according to Embodiment 5 of the invention will now be described with reference to FIGS. 8A through 8D.

First, a positive chemically amplified resist material having the following composition is prepared:

| | |
|---|---|
| First base polymer: poly((norbornene-5-methylenehexafluoroisopropyl alcohol ethoxymethyl ether) (40 mol %) – (norbornene-5-methylenehexafluoroisopropyl alcohol) (60 mol %)) | 2 g |
| Compound protected by acid stable group: isobornyl methacrylate | 0.4 g |
| Acid generator: triphenylsulfonium triflate | 0.06 g |
| Quencher: triethanolamine | 0.002 g |
| Solvent: propylene glycol monomethyl ether acetate | 20 g |

Figure 8A:
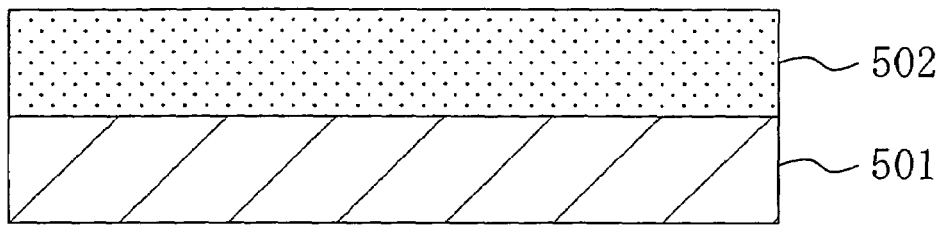
FIGS. 8A, 8B, 8C and 8D are cross-sectional views for showing procedures in a pattern formation method according to Embodiment 5 of the invention.

Next, as shown in FIG. 8A, the aforementioned chemically amplified resist material is applied on a substrate 501 so as to form a resist film 502 with a thickness of 0.35 μm.

Figure 8B:
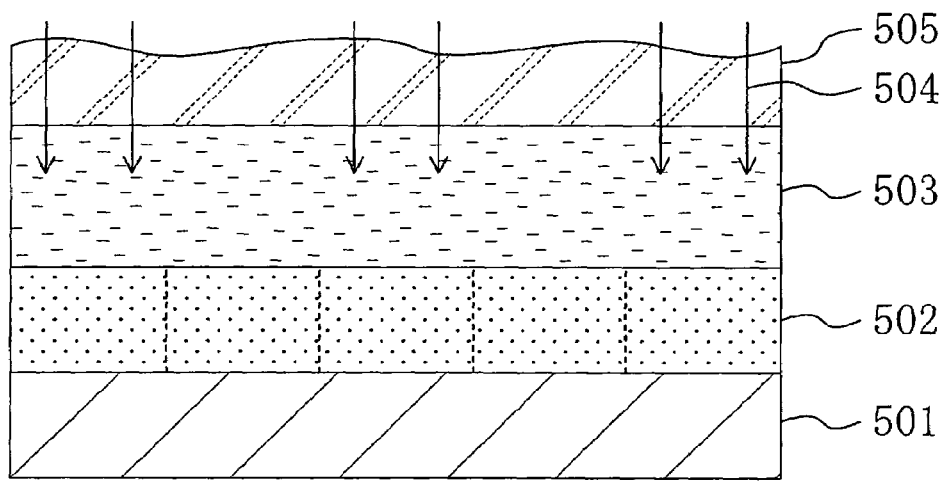

Next, as shown in FIG. 8B, with an immersion liquid 503 of water provided between the resist film 502 and a projection lens 505 by, for example, the puddle method, pattern exposure is carried out by irradiating the resist film 502 through a mask (not shown) with exposing light 504 of ArF excimer laser with NA of 0.68.

Figure 8C:
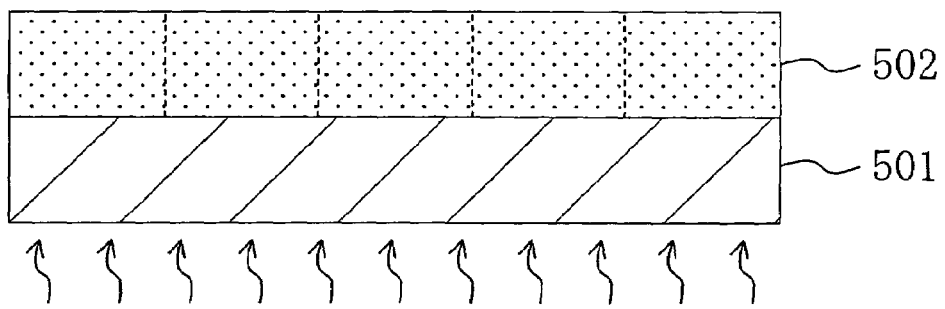

After the pattern exposure, as shown in FIG. 8C, the resist film 502 is baked with a hot plate at a temperature of 105° C. for 60 seconds (post exposure bake).

Figure 8D:
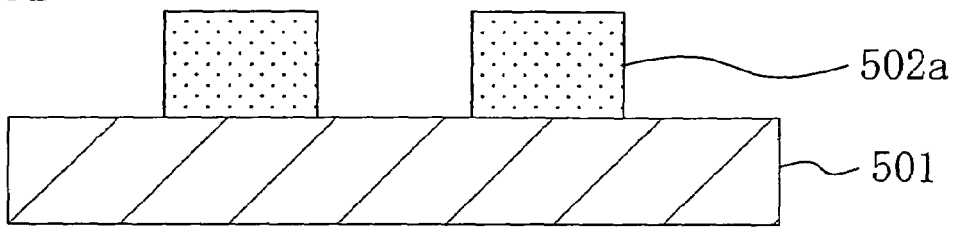

Next, the resultant resist film 502 is developed with a 0.26 N tetramethylammonium hydroxide developer. In this manner, a resist pattern 502a made of an unexposed portion of the resist film 502 and having a line width of 0.09 μm is formed in a good shape as shown in FIG. 8D.

In this manner, according to the pattern formation method of Embodiment 5, in the step of forming the resist film shown in FIG. 8A, the resist material used for forming the resist film 502 includes, in addition to the base polymer in which part of alkali-soluble groups are protected by an acid labile group labilized by an acid, the methacrylic acid corresponding to the compound in which an alkali-soluble group is protected by an acid stable group (i.e., an isobornyl group), namely, isobornyl methacrylate. Therefore, since an interaction caused between the resist film 502 and the liquid 503 provided on the resist film 502 is reduced, the liquid 503 minimally permeates into the resist film 502, and hence, the resist film 502 is prevented from being softened and its dissolution rate in the developer is lowered. On the contrary, in an exposed portion of the resist film 502, an acid generated from the acid generator through the irradiation with the exposing light 504 inactivates the acid labile group of the base polymer, and hence, the exposed portion is easily dissolved in the developer. In addition, since the alkali-soluble group is protected by the acid stable group in the isobornyl methacrylate, the alkali-soluble group is not inactivated by the acid generated from the acid generator even in the vicinity of a boundary between the unexposed portion and the exposed portion of the resist film 502. Since the alkali-soluble group of the compound is thus protected, the unexposed portion is insoluble in the alkaline developer. As a result, the contrast between the exposed portion and the unexposed portion is improved and the unexposed portion of the resist film 502 is not affected by the liquid 503, so that the fine resist pattern 502a can be formed in a good shape.

Embodiment 6

A pattern formation method according to Embodiment 6 of the invention will now be described with reference to FIGS. 9A through 9D.

First, a positive chemically amplified resist material having the following composition is prepared:

| | |
|---|---|
| First base polymer: poly(norbornene-5-methylenehexafluoroisopropyl alcohol) | 2 g |
| Compound protected by acid labile group: 2-methyl-2-adamantyl acrylate | 0.3 g |
| Second base polymer: poly(methyl acrylate) | 0.1 g |
| Acid generator: triphenylsulfonium triflate | 0.06 g |
| Quencher: triethanolamine | 0.002 g |
| Solvent: propylene glycol monomethyl ether acetate | 20 g |

Figure 9A:
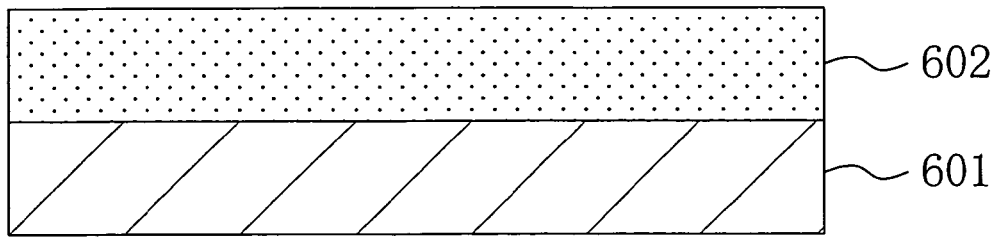
FIGS. 9A, 9B, 9C and 9D are cross-sectional views for showing procedures in a pattern formation method according to Embodiment 6 of the invention.

Next, as shown in FIG. 9A, the aforementioned chemically amplified resist material is applied on a substrate 601 so as to form a resist film 602 with a thickness of 0.35 µm.

Figure 9B:
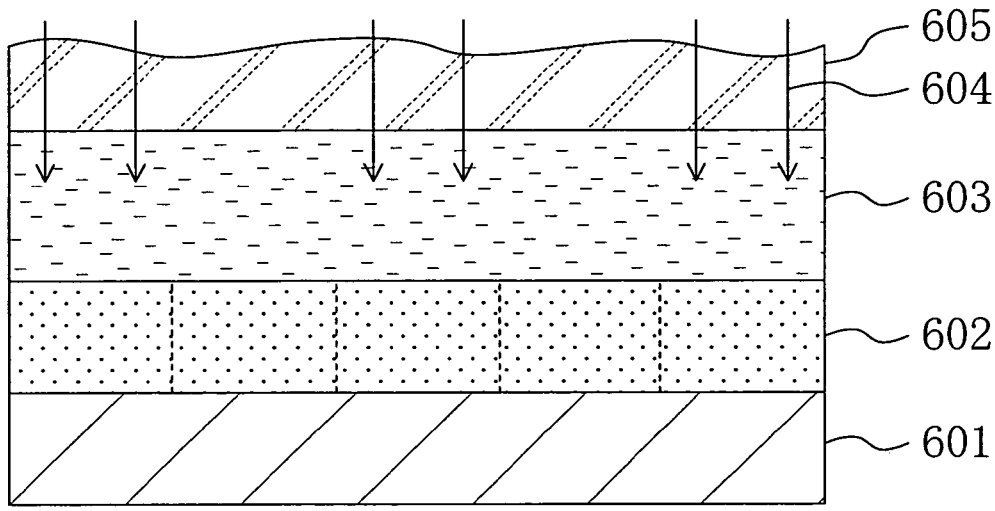

Next, as shown in FIG. 9B, with an immersion liquid 603 of water provided between the resist film 602 and a projection lens 605 by, for example, the puddle method, pattern exposure is carried out by irradiating the resist film 602 through a mask (not shown) with exposing light 604 of ArF excimer laser with NA of 0.68.

Figure 9C:
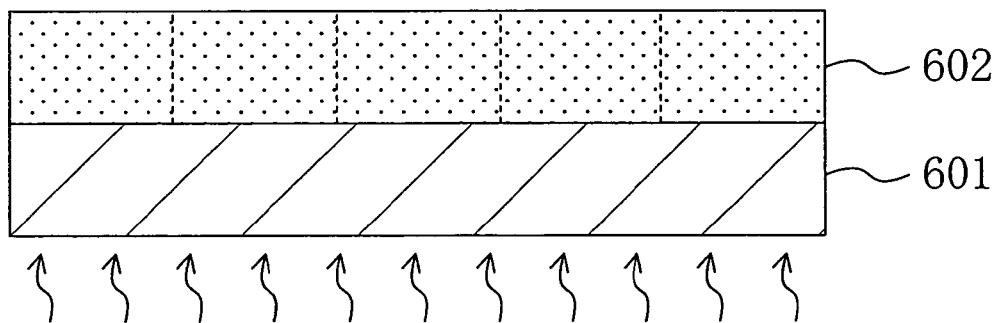

After the pattern exposure, as shown in FIG. 9C, the resist film 602 is baked with a hot plate at a temperature of 105° C. for 60 seconds (post exposure bake).

Figure 9D:
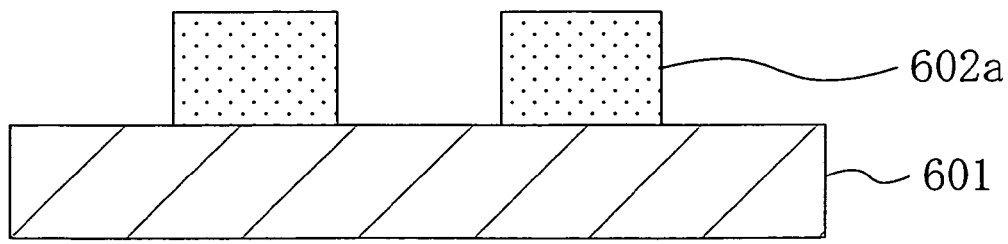

Next, the resultant resist film 602 is developed with a 0.26 N tetramethylammonium hydroxide developer. In this manner, a resist pattern 602a made of an unexposed portion of the resist film 602 and having a line width of 0.09 µm is formed in a good shape as shown in FIG. 9D.

In this manner, according to the pattern formation method of Embodiment 6, in the step of forming the resist film shown in FIG. 9A, the resist material used for forming the resist film 602 includes, in addition to the first base polymer in which part of alkali-soluble groups are protected by an acid labile group labilized by an acid, the acrylic acid corresponding to the compound in which all or, for example, 70% of alkali-soluble groups are protected by an acid labile group labilized by an acid (i.e., a 2-methyl-2-adamantyl group), namely, 2-methyl-2-admanatyl methacrylate and the polyacrylic acid corresponding to the second base polymer in which an alkali-soluble group is protected by an acid stable group (i.e., a methyl group), namely, poly(methyl acrylate). Therefore, since an interaction caused between the resist film 602 and the liquid 603 provided on the resist film 602 is reduced, the liquid 603 minimally permeates into the resist film 602, and hence, the resist film 602 is prevented from being softened and its dissolution rate in the developer is lowered. On the contrary, in an exposed portion of the resist film 602, an acid generated from the acid generator through the irradiation with the exposing light 604 inactivates the acid labile groups of the first base polymer and the acrylic acid, and hence, the exposed portion is easily dissolved in the developer. In addition, since the alkali-soluble group is protected by the acid stable group in the poly(methyl acrylate) used as the second base polymer, the unexposed portion of the resist film 602 is not inactivated by the acid generated from the acid generator even in the vicinity of the boundary with the exposed portion. Since the alkali-soluble group of the second base polymer is thus protected, the unexposed portion is insoluble in the alkaline developer. As a result, the contrast between the exposed portion and the unexposed portion is improved and the unexposed portion of the resist film 602 is not affected by the liquid 603, so that the fine resist pattern 602a can be formed in a good shape.

In each of Embodiments 1 through 6, the base polymer can be polyhydroxystyrene, polymethacrylic acid, polyacrylic acid, polynorbornene carboxylic acid, polynorbornene methylenehexafluoroisopropyl alcohol, polynorbornene hexafluoroisopropyl alcohol, a norbornene hexafluoroisopropyl alcohol/maleic anhydride copolymer, a norbornene carboxylic acid/maleic anhydride copolymer or a norbornene methylenehexafluoroisopropyl alcohol/maleic anhydride copolymer.

Also, the compound to be included in the resist material can be, instead of the methacrylic acid or the acrylic acid, hydroxystyrene, bisphenol A, pyrogallol, norbornene carboxylic acid, norbornene methylenehexafluoroisopropyl alcohol, norbornene hexafluoroisopropyl alcohol, norbornene hexafluoroisopropyl alcohol/maleic anhydride, norbornene carboxylic acid/maleic anhydride or norbornene methylenehexafluoroisopropyl alcohol/maleic anhydride.

Furthermore, the alkali-soluble group of the base polymer or the compound to be included in the resist material can be a hydroxy group or a carboxylic group.

The acid labile group used for protecting the alkali-soluble group can be a t-butyl group, a t-butyloxycarbonyl group or a methoxymethyl group instead of the 2-methyl-2-adamantyl group.

The acid stable group used for protecting the alkali-soluble group can be an ethyl group, an isopropyl group or an adamantyl group instead of the methyl group or the isobornyl group.

The acid generator can be, instead of triphenylsulfonium triflate (triphenylsulfonium trifluoromethane sulfonate), at least one of the group consisting of triphenylsulfonium nonafluorobutane sulfonate, triphenylsulfonium perfluorooctane sulfonate, diphenyliodonium trifluoromethane sulfonate, diphenyliodonium nonafluorobutane sulfonate, diphenyliodonium perfluorooctane sulfonate, di(p-t-butylphenyl)iodonium trifluoromethane sulfonate, di(p-t-butylphenyl) nonafluorobutane sulfonate and di(p-t-butylphenyl) perfluorooctane sulfonate.

The immersion liquid may be perfluoropolyether instead of water.

The exposing light used for exposing the resist film can be KrF excimer laser, $Xe_2$ laser, $F_2$ laser, KrAr laser or $Ar_2$ laser instead of ArF excimer laser.

As described so far, according to the resist material and the pattern formation method using the same of this invention, a resist film can be prevented from being softened by a liquid used for the immersion lithography, and hence, a resist pattern can be formed in a good shape. Thus, the invention is useful as, for example, a method for forming a fine pattern for use in fabrication process or the like for semiconductor devices.

What is claimed is:

1. A resist material comprising:
   a first polymer in which hydrogen atoms of alkali-soluble groups are replaced with an acid labile group stable to water and labilized by an acid;
   a second polymer in which at least one hydrogen atom of an alkali-soluble group is replaced with an acid stable group; and
   an acid generator.

2. A resist material comprising:
   a polymer in which hydrogen atoms of alkali-soluble groups are replaced with an acid labile group stable to water and labilized by an acid;
   a compound in which at least one hydrogen atom of an alkali-soluble group is replaced with an acid stable group; and
   an acid generator.

3. A resist material comprising:
   a first polymer;
   a compound in which at least one hydrogen atom of an alkali-soluble group is replaced with an acid labile group stable to water and labilized by an acid;
   a second polymer in which at least one hydrogen atom of an alkali-soluble group is replaced with an acid stable group and which is different from the first polymer; and
   an acid generator.

4. The resist material of claim 1,
   wherein said acid stable group is a methyl group, an ethyl group, an isopropyl group, an adamantyl group or an isobornyl group.

5. A pattern formation method comprising the steps of:
   forming a resist film on a substrate;
   performing pattern exposure by selectively irradiating said resist film with exposing light with a liquid provided on said resist film; and
   forming a resist pattern by developing said resist film after the pattern exposure,
   wherein said resist film is made of a resist material including:
      a first polymer in which hydrogen atoms of alkali-soluble groups are replaced with an acid labile group stable to water and labilized by an acid;
      a second polymer in which at least one hydrogen atom of an alkali-soluble group is replaced with an acid stable group; and
      an acid generator.

6. A pattern formation method comprising the steps of:
   forming a resist film on a substrate;
   performing pattern exposure by selectively irradiating said resist film with exposing light with a liquid provided on said resist film; and
   forming a resist pattern by developing said resist film after the pattern exposure,
   wherein said resist film is made of a resist material including:
      a polymer in which hydrogen atoms of alkali-soluble groups are replaced with an acid labile group stable to water and labilized by an acid;
      a compound in which at least one hydrogen atom of an alkali-soluble group is replaced with an acid stable group; and
      an acid generator.

7. A pattern formation method comprising the steps of:
   forming a resist film on a substrate;
   performing pattern exposure by selectively irradiating said resist film with exposing light with a liquid provided on said resist film; and
   forming a resist pattern by developing said resist film after the pattern exposure,
   wherein said resist film is made of a resist material including:
      a first polymer;
      a compound in which at least one hydrogen atom of an alkali-soluble group is replaced with an acid labile group stable to water and labilized by an acid;
      a second polymer in which at least one hydrogen atom of an alkali-soluble group is replaced with an acid stable group and which is different from the first polymer; and
      an acid generator.

8. The resist material of claim 2,
   wherein said acid stable group is a methyl group, an ethyl group, an isopropyl group, an adamantyl group or an isobornyl group.

9. The resist material of claim 3,
   wherein said acid stable group is a methyl group, an ethyl group, an isopropyl group, an adamantyl group or an isobornyl group.

10. The pattern formation method of claim 6,
    wherein said acid stable group is a methyl group, an ethyl group, an isopropyl group, an adamantyl group or an isobornyl group.

11. The pattern formation method of claim 7,
    wherein said acid stable group is a methyl group, an ethyl group, an isopropyl group, an adamantyl group or an isobornyl group.

* * * * *